United States Patent
Kim

(10) Patent No.: US 9,275,705 B2
(45) Date of Patent: Mar. 1, 2016

(54) INTEGRATED CIRCUIT FOR STORING INFORMATION

(71) Applicant: SK hynix Inc., Gyeonggi-do (KR)

(72) Inventor: Kyung-Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/858,677

(22) Filed: Sep. 18, 2015

(65) Prior Publication Data

US 2016/0012872 A1  Jan. 14, 2016

Related U.S. Application Data

(62) Division of application No. 13/331,921, filed on Dec. 20, 2011, now Pat. No. 9,165,616.

(30) Foreign Application Priority Data

Feb. 28, 2011 (KR) .................. 10-2011-0017638

(51) Int. Cl.
*G11C 5/14* (2006.01)
*G11C 7/22* (2006.01)
*G11C 7/10* (2006.01)

(52) U.S. Cl.
CPC . *G11C 7/22* (2013.01); *G11C 7/106* (2013.01)

(58) Field of Classification Search
CPC .................................. G11C 5/14; G11C 5/142
USPC ........................................... 365/226, 227, 228
See application file for complete search history.

(56) References Cited

U.S. PATENT DOCUMENTS

2005/0093529 A1* 5/2005 Hur .......................... G05F 3/205
  323/313
2011/0260756 A1* 10/2011 Agut .................. H03K 19/0013
  327/81

* cited by examiner

*Primary Examiner* — Han Yang
(74) *Attorney, Agent, or Firm* — IP & T Group LLP

(57) ABSTRACT

An integrated circuit includes a variable resistance unit including at least one transistor that receives a control signal and changes a resistance through the transistor in response to the control signal in a programming operation mode and an information detection unit configured to detect programming information in response to an output voltage of the variable resistance unit in a normal operation mode.

4 Claims, 2 Drawing Sheets

INTEGRATED CIRCUIT FOR STORING INFORMATION

CROSS-REFERENCE TO RELATED APPLICATIONS

This application is a division of U.S. patent application Ser. No. 13/331,921 filed on Dec. 20, 2011, which claims priority of Korean Patent Application No. 10-2011-0017638, filed on Feb. 28, 2011. The disclosure of each of the foregoing application which is incorporated herein by reference in its entirety.

BACKGROUND

1. Field

Exemplary embodiments of the present invention relate to semiconductor design technology for storing information, and more particularly, to an integrated circuit that performs an operation similar to that of a fuse.

2. Description of the Related Art

In general, a semiconductor memory device such as a double data rate synchronous DRAM (DDR SDRAM) has various circuits therein in order to perform various operations. As an example, a fuse circuit may be included as a circuit component. The fuse circuit performs an operation for storing desired information. To this end, the fuse circuit has a general fuse or an anti-fuse therein. The general fuse and the anti-fuse are elements have characteristics opposite to each other. The general fuse is fabricated in an initial short fuse state and is subsequently programmed (for example, to an open state) according to different use. However, the anti-fuse is fabricated in an open state and is subsequently programmed to a short fuse state according to different use. Here, the programming indicates a series of operations for storing desired information in the general fuse and the anti-fuse.

While the general fuse may be implemented in a relatively small area, its program is performed at a wafer state. On the other hand, while the anti-fuse can be programmed using a programming voltage in a package state, it occupies a relatively large area, is complicated, and uses precise control technology.

SUMMARY

Embodiments of the present invention are directed to an integrated circuit capable of storing desired information without using a fuse circuit such as a general fuse and an anti-fuse.

In accordance with an embodiment of the present invention, an integrated circuit includes: a variable resistance unit including at least one transistor that receives a control signal and changes a resistance through the transistor in response to the control signal in a programming operation mode; and an information detection unit configured to detect programming information in response to an output voltage of the variable resistance unit in a normal operation mode.

In accordance with an embodiment of the present invention, an integrated circuit includes: first and second transistors configured to change resistances through the transistors in response to first and second control signals, respectively, in a programming operation mode, wherein the first and second transistors are commonly coupled to an output terminal; a power transfer unit configured to transfer a power voltage to the second transistor in response to a third control signal in the programming operation mode; and an information detection unit configured to detect programming information in response to a voltage of the output terminal in a normal operation mode.

In accordance with an embodiment of the present invention, an integrated circuit includes: a first variable resistance unit including first and second transistors configured to change resistances through the first and second transistors in response to first and second control signals in a programming operation mode, wherein the first and second transistors are commonly coupled to a first output terminal; a second variable resistance unit including third and fourth transistors configured to change resistances through the third and fourth transistors values in response to third and fourth control signals in the programming operation mode, wherein the third and fourth transistors are commonly coupled to a second output terminal; and an information detection unit configured to compare voltages of the first and second output terminals and detect programming information in a normal operation mode.

In the integrated circuit in accordance with the embodiments of the present invention, threshold voltage values of transistors may be adjusted by applying a desired voltage to input terminals of the transistors in the programming operation mode, and detect the threshold voltage values, which have been adjusted in the programming operation mode, in the normal operation mode. As a consequence, the adjusted threshold voltage values similar to programming values of a general fuse circuit can be used instead of the general fuse circuit.

DETAILED DESCRIPTION

Figure 1:
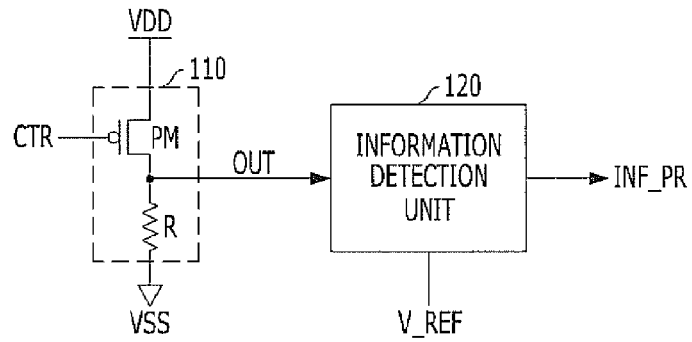
FIG. 1 is a diagram illustrating an integrated circuit in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram illustrating an integrated circuit in accordance with a first embodiment of the present invention.

Referring to FIG. 1, the integrated circuit includes a variable resistance unit 110 and an information detection unit 120.

The variable resistance unit 110 is configured to change its resistance value in response to a control signal CTR in a programming operation mode and includes a PMOS transistor PM and a resistor R. The PMOS transistor PM has a source-drain path formed between a power supply voltage VDD terminal and an output terminal OUT and receives the control signal CTR through a gate thereof. The resistor R is coupled between the output terminal OUT and a ground supply voltage VSS terminal. The resistor R has a fixed resistance value.

The integrated circuit in accordance with the embodiment of the present invention has a programming operation mode and a normal operation mode, and the programming operation mode will be described below.

In the programming operation mode, since the control signal CTR has a voltage level corresponding to a logic 'low', the PMOS transistor PM is turned on. At this time, since a Vgs of the PMOS transistor PM is larger than a threshold voltage value of the PMOS transistor PM, characteristics of the PMOS transistor PM as a switch deteriorate and result in an increase in a turn-on resistance value of the PMOS transistor PM through the programming operation mode.

Next, the normal operation mode will be described.

In the normal operation mode, the information detection unit 120 is configured to detect a voltage level of the output terminal OUT and output programming information INF_PR. The programming information INF_PR indicates a state of the resistance unit 110 including the state in which the turn-on resistance value of the PMOS transistor PM has been increased and the state in which the turn-on resistance value of the PMOS transistor PM has not been increased. For example, the state in which the turn-on resistance value of the PMOS transistor PM has been increased corresponds to the case in which a general fuse has been cut, and the state in which the turn-on resistance value of the PMOS transistor PM has not been increased corresponds to the case in which the general fuse has not been cut. That is, in the normal operation mode, the control signal CTR is also logic 'low' and the voltage level of the output terminal OUT is changed according to the turn-on resistance value of the PMOS transistor PM.

As described above, in the normal operation mode, the information detection unit 120 detects the programming information INF_PR in response to the output terminal OUT. In the first embodiment, a voltage of the output terminal OUT is compared with a desired reference voltage V_REF and the programming information INF_PR is output. More specifically, the information detection unit 120 compares the voltage level of the output terminal OUT corresponding to the turn-on resistance value of the PMOS transistor PM with a voltage level of the reference voltage V_REF and outputs the programming information INF_PR.

Here, the integrated circuit in accordance with the first embodiment can adjust the turn-on resistance value of the PMOS transistor PM according to the control signal CTR in the programming operation mode and detect the programming information INF_PR corresponding to the adjusted turn-on resistance value in the normal operation mode.

Figure 2:
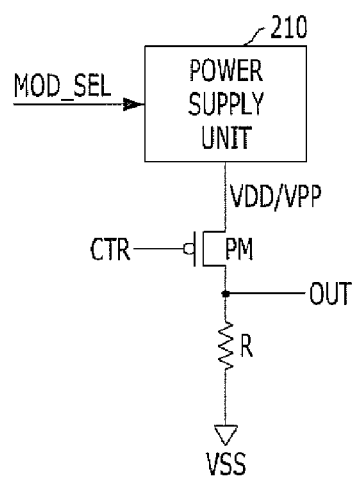
FIG. 2 is a diagram illustrating the case in which a power supply unit is added in accordance with a first embodiment of the present invention.

FIG. 2 is a diagram illustrating the case in which a power supply unit is added in accordance with the first embodiment of the present invention. For the purpose of illustration, an added power supply unit 210 will be described.

Referring to FIG. 2, the power supply unit 210 is configured to change a power voltage, which is supplied to the PMOS transistor PM in response to a mode select signal MOD_SEL, to a power supply voltage VDD or a pumping power voltage VPP and supply the power supply voltage VDD or the pumping power voltage VPP. The mode select signal MOD_SEL corresponds to the programming operation mode and the normal operation mode, and the pumping power voltage VPP has a voltage level higher than the power supply voltage VDD.

In the case of the PMOS transistor PM, as the difference between the Vgs and the threshold voltage thereof is large, deterioration of characteristics of the PMOS transistor PM as a switch/conductor is accelerated. Therefore, in the programming operation mode, when the pumping power voltage VPP is applied to the PMOS transistor PM, deterioration of characteristics of the PMOS transistor PM is accelerated. Here, the turn-on resistance value of the PMOS transistor PM may be quickly increased.

Figure 3:
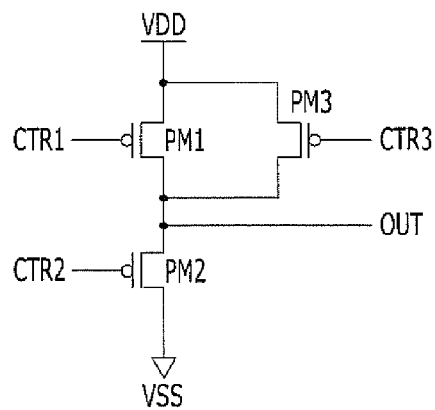
FIG. 3 is a diagram illustrating an integrated circuit in accordance with a second embodiment of the present invention.

FIG. 3 is a diagram illustrating an integrated circuit in accordance with a second embodiment of the present invention. For the purpose of illustration, FIG. 3 illustrates a configuration corresponding to the variable resistance unit 110 of FIG. 1.

Referring to FIG. 3, a variable resistance unit in accordance with the second embodiment includes first to third PMOS transistors PM1 to PM3.

The first PMOS transistor PM1 changes its resistance value in response to a first control signal CTR1 in the programming operation mode, has a source-drain path formed between a power supply voltage VDD terminal and an output terminal OUT, and receives the first control signal CTR1 through a gate thereof. The second PMOS transistor PM2 changes its resistance value in response to a second control signal CTR2 in the programming operation mode, has a source-drain path formed between the output terminal OUT and a ground supply voltage VSS terminal, and receives the second control signal CTR2 through a gate thereof. The third PMOS transistor PM3 serves as a power transfer unit for transferring a power voltage to the second PMOS transistor PM2 in response to a third control signal CTR3 in the programming operation mode.

The variable resistance unit in accordance with the second embodiment of the present invention can adjust a turn-on resistance value of the first PMOS transistor PM1 or a turn-on resistance value of the second PMOS transistor PM2 according to the first to third control signals CTR1 to CTR3. Table 1 below indicates the states of the turn-on resistance values of the first and second PMOS transistor PM1 and PM2 according to the first to third control signals CTR1 to CTR3.

TABLE 1

| CTR1 | CTR2 | CTR3 | |
|------|------|------|---|
| L | H | H | turn-on resistance value of PM1 is increased |
| H | L | L | turn-on resistance value of PM2 is increased |

As can be seen from Table 1 above, in order to increase the turn-on resistance value of the first PMOS transistor PM1, the first control signal CTR1 is controlled to be logic 'low'. In such a case, since a Vgs of the first PMOS transistor PM1 is larger than a threshold voltage of the first PMOS transistor PM1 and characteristics of the first PMOS transistor PM1 deteriorate, the turn-on resistance value of the first PMOS transistor PM1 is increased. In order to increase the turn-on resistance value of the second PMOS transistor PM2, the second and third control signals CTR2 and CTR3 are controlled to be logic 'low'. In such a case, the third PMOS transistor PM3 supplies a power supply voltage VDD to the second PMOS transistor PM2, and characteristics (e.g., characteristics as a switch/conductor) of the second PMOS transistor PM2 deteriorate by the power supply voltage VDD and the second control signal CTR2, resulting in an increase in the turn-on resistance value of the second PMOS transistor PM2.

Meanwhile, in the normal operation mode, the first and second control signals CTR1 and CTR2 are logic 'low' and the third control signal CTR3 is logic 'high'. Thus, a voltage level of the output terminal OUT is changed according to the turn-on resistance values of the first and second PMOS transistor PM1 and PM2 in the programming operation mode.

As described above, the turn-on resistance values of the first and second PMOS transistor PM1 and PM2 are changed according to the first to third control signals CTR1 to CTR3. The first to third control signals CTR1 to CTR3 can be controlled according to desired data as indicated by Table 1 above. Here, the turn-on resistance value of one of the first and second PMOS transistor PM1 and PM2 may be increased according to data, so that appropriate data is stored in the first and second PMOS transistor PM1 and PM2.

Figure 4:
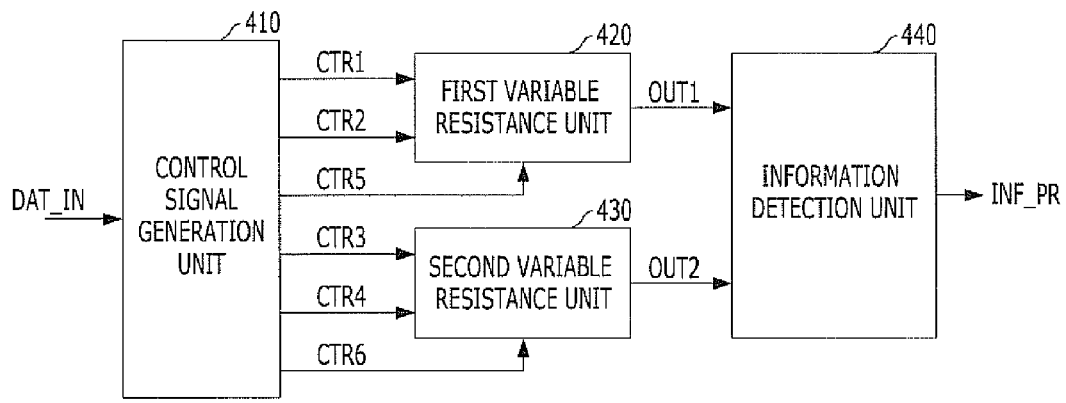
FIG. 4 is a block diagram illustrating an integrated circuit in accordance with a third embodiment of the present invention.

FIG. 4 is a block diagram illustrating an integrated circuit in accordance with a third embodiment of the present invention.

Referring to FIG. 4, the integrated circuit includes a control signal generation unit 410, a first variable resistance unit 420, a second variable resistance unit 430, and an information detection unit 440.

The control signal generation unit 410 is configured to generate first to sixth control signals CTR1 to CTR6 in response to input data DAT_IN. In the third embodiment, the six control signals CTR1 to CTR6 are generated corresponding to one input data DAT_IN. However, three control signals may also be generated corresponding to one data as in the second embodiment of FIG. 3, or one control signal may also be generated as in the first embodiment of FIG. 1.

The first variable resistance unit 420 is configured to change its resistance value in response to the first and second control signals CTR1 and CTR2 and the fifth control signal CTR5, and may have a configuration similar to that of the second embodiment of FIG. 3. Similarly, the second variable resistance unit 430 is configured to change its resistance value in response to the third and fourth control signals CTR3 and CTR4 and the sixth control signal CTR6, and may also have a configuration similar to that of the second embodiment.

Thus, in the programming operation mode, for example, when the input data DAT_IN is logic 'high', a voltage level of a first output terminal OUT1 may be set to be higher than a voltage level of a second output terminal OUT2. However, when the input data DAT_IN is logic 'low', the voltage level of the first output terminal OUT1 may be set to be lower than the voltage level of the second output terminal OUT2. In other words, in the programming operation mode, the input data DAT_IN is stored in the first and second resistance units 420 and 430.

The information detection unit 440 is configured to compare the voltages of the first and second output terminals OUT1 and OUT2 with each other, detect programming information, and output the programming information INF_PR in the normal operation mode.

Figure 5:
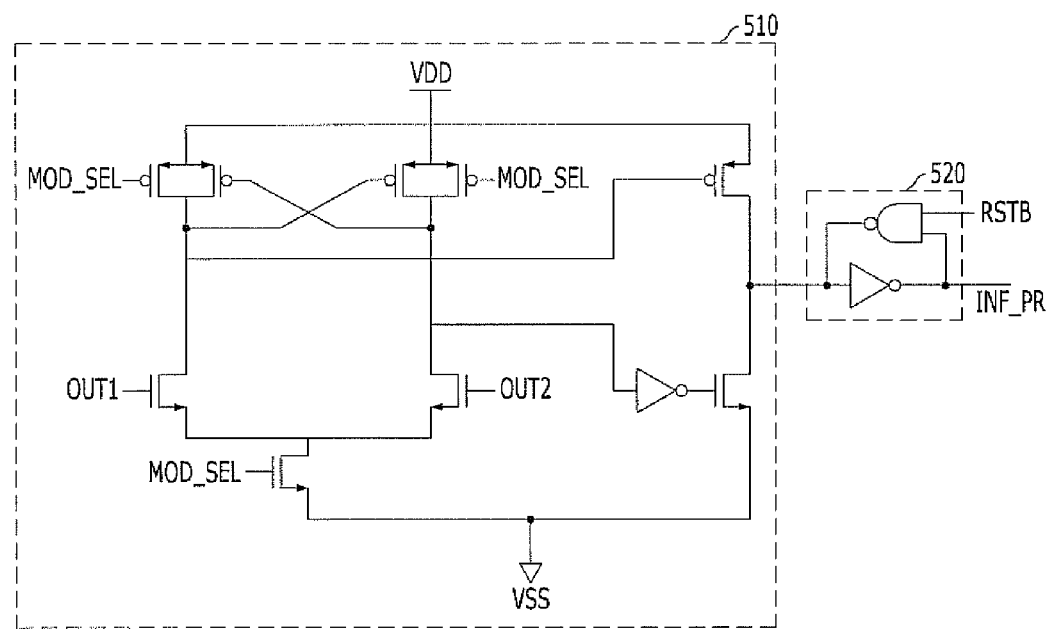
FIG. 5 is a circuit diagram illustrating an information detection unit 440 of FIG. 4.

FIG. 5 is a circuit diagram illustrating the information detection unit 440 of FIG. 4.

Referring to FIG. 5, the information detection unit 440 includes a comparison section 510 and a latching section 520.

The comparison section 510 is configured to be activated in response to a mode select signal MOD_SEL in the normal operation mode and compare the voltage levels of the first and second output terminals OUT1 and OUT2 with each other. The mode select signal MOD_SEL is logic 'low' in the programming operation mode and is logic 'high' in the normal operation mode. Thus, the comparison section 510 is deactivated in the programming operation mode and is activated in the normal operation mode. The latching section 520 is configured to latch an output signal of the comparison section 510 and output the programming information INF_PR.

As a consequence, the generated programming information INF_PR corresponds to the input data DAT_IN, where the input data DAT_IN input in the programming operation mode may be stored in the first and second resistance units 420 and 430 and output in the normal operation mode.

The integrated circuits in accordance with the first to third embodiments of the present invention can store desired data in a corresponding transistor in response to a control signal in the programming operation mode and detect the stored data in the normal operation mode. This represents that such an operation can be performed in a package state in accordance with the first to third embodiments of the present invention. Thus, an operation for storing desired data in the package state without using an existing fuse circuit may be performed.

According to the present invention, desired information may be stored using a transistor with a small area in a package state.

While the present invention has been described with respect to the specific embodiments, it will be apparent to those skilled in the art that various changes and modifications may be made without departing from the spirit and scope of the invention as defined in the following claims.

In the above-mentioned embodiments, while the PMOS transistor is illustrated, the exemplary embodiments of the present invention may also applied to the case in which other types of transistors are used. Moreover, the position and type of the logic gate and transistor described in the above-mentioned embodiment may be changed according to the polarity of an input signal.

What is claimed is:

1. An integrated circuit comprising:
a first variable resistance unit including first and second transistors configured to change resistances through the first and second transistors in response to first and second control signals in a programming operation mode, wherein the first and second transistors are commonly coupled to a first output terminal;
a second variable resistance unit including third and fourth transistors configured to change resistances through the third and fourth transistors values in response to third and fourth control signals in the programming operation mode, wherein the third and fourth transistors are commonly coupled to a second output terminal; and
an information detection unit configured to compare voltages of the first and second output terminals and detect programming information in a normal operation mode.

2. The integrated circuit of claim 1, wherein the first variable resistance unit further comprises:
a first power transfer section configured to transfer a power voltage to the second transistor in response to a fifth control signal in the programming operation mode, and
wherein the second variable resistance unit further comprises:
a second power transfer section configured to transfer a power voltage to the fourth transistor in response to a sixth control signal in the programming operation mode.

3. The integrated circuit of claim 2, wherein the second control signal and the fifth control signal have overlapping activation periods, and the fourth control signal and the sixth control signal have overlapping activation periods in the programming operation mode.

4. The integrated circuit of claim 1, wherein the information detection unit comprises:

a comparison section configured to be activated in the normal operation mode and compare voltage levels of the first and second output terminals; and a latching section configured to latch an output signal of the comparison section and output the programming information.

* * * * *